(12) United States Patent
Jo et al.

(10) Patent No.: US 10,396,713 B2
(45) Date of Patent: Aug. 27, 2019

(54) ENVELOPE-TRACKING CURRENT BIAS CIRCUIT WITH OFFSET CANCELLATION FUNCTION

(71) Applicant: Samsung Electro-Mechanics Co., Ltd., Suwon-si (KR)

(72) Inventors: Byeong Hak Jo, Suwon-si (KR); Jeong Hoon Kim, Suwon-si (KR); Jong Ok Ha, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/810,764

(22) Filed: Nov. 13, 2017

(65) Prior Publication Data
US 2018/0342984 A1    Nov. 29, 2018

(30) Foreign Application Priority Data

May 26, 2017    (KR) .................. 10-2017-0065579

(51) Int. Cl.
| | | |
|---|---|---|
| *H03F 3/45* | (2006.01) | |
| *H03F 1/02* | (2006.01) | |
| *H03F 3/21* | (2006.01) | |
| *H03F 3/189* | (2006.01) | |
| *H03F 3/24* | (2006.01) | |

(52) U.S. Cl.
CPC ............... *H03F 1/02* (2013.01); *H03F 3/189* (2013.01); *H03F 3/21* (2013.01); *H03F 3/24* (2013.01); *H03F 3/45475* (2013.01); *H03F 2200/102* (2013.01); *H03F 2200/241* (2013.01); *H03F 2200/375* (2013.01); *H03F 2200/451* (2013.01); *H03F 2203/45102* (2013.01)

(58) Field of Classification Search
CPC .......... H03F 1/02; H03F 3/21; H03F 3/45475; H03F 2200/241; H03F 2203/45102; H03F 2200/102; H03F 1/3211; H03F 3/45; H03F 3/45183; H03F 2200/153; H03F 2203/30036; H03F 3/45479; H03F 1/301; H03F 1/302; H03F 3/04; H03F 2200/18; H03F 1/0222; H03G 3/20; H03G 3/3042
USPC ..................................... 330/136, 285, 296
See application file for complete search history.

(56) References Cited

U.S. PATENT DOCUMENTS 5,374,896 A * 12/1994 Sato .................. H03F 1/3247
                                                        330/136
5,886,572 A *  3/1999 Myers ................... H03C 5/00
                                                        330/10

(Continued)

FOREIGN PATENT DOCUMENTS

JP          9-7200 A       1/1997

*Primary Examiner* — Khanh V Nguyen
(74) *Attorney, Agent, or Firm* — NSIP Law

(57) ABSTRACT

An envelope-tracking current bias circuit includes a first rectifying circuit, a second rectifying circuit, and a first arithmetic circuit. The first rectifying circuit is configured to detect an envelope of an input signal, and provide an envelope detection signal comprising a first direct current (DC) offset voltage. The second rectifying circuit is configured to provide a second DC offset voltage corresponding to the first DC offset voltage. The first arithmetic circuit is configured to provide an envelope signal in which the first DC offset voltage is reduced through subtraction between the envelope detection signal and the second DC offset voltage.

16 Claims, 7 Drawing Sheets

(56) References Cited

U.S. PATENT DOCUMENTS

| | | | |
|---|---|---|---|
| 6,784,740 B1* | 8/2004 | Tabatabaei | H03F 1/223 330/136 |
| 8,519,797 B2* | 8/2013 | Wang | H03F 1/0266 330/296 |
| 9,331,653 B2 | 5/2016 | Khesbak et al. | |
| 9,350,302 B2* | 5/2016 | Wimpenny | H03F 3/211 |
| 9,385,666 B2* | 7/2016 | Tam | H03F 1/3247 |
| 2008/0258831 A1* | 10/2008 | Kunihiro | H03C 5/00 332/103 |
| 2017/0163216 A1* | 6/2017 | Li | H03F 1/32 |

* cited by examiner

ENVELOPE-TRACKING CURRENT BIAS CIRCUIT WITH OFFSET CANCELLATION FUNCTION

CROSS-REFERENCE TO RELATED APPLICATION(S)

This application claims benefit under 35 USC 119(a) of Korean Patent Application No. 10-2017-0065579 filed on May 26, 2017 in the Korean Intellectual Property Office, the entire disclosure of which is incorporated herein by reference for all purposes.

BACKGROUND

1. Field

The following description relates to an envelope-tracking current bias circuit capable of being used in a power amplifying system.

2. Description of Related Art

In general, average power tracking (APT) or envelope tracking (ET) may be used as a method of reducing current consumption of a power amplifier module (PAM).

APT is a method of improving efficiency by controlling VCC depending on average output power, while ET is a method of changing a power supply voltage of a power amplifier (PA) depending on an envelope of a radio frequency (RF) signal.

ET is a method of lowering the power supply voltage of the PA with respect to a portion having a low amplitude in the RF signal to reduce average current consumption, but raising the power supply voltage of the PA with respect to a portion having a large amplitude in the RF signal to prevent linearity from being deteriorated.

In APT, VCC follows an average value for a predetermined time, while in ET, VCC follows an output instantaneous value. An ET modulator for generating VCC, simultaneously following an envelope signal, is thus separately required.

In addition, an ET bias circuit may be used in order to further reduce current consumption, and an existing ET bias circuit may use a rectifying circuit in order to detect an envelope signal of an input signal.

However, the rectifying circuit may include a plurality of passive elements and rectifying diodes, and in these passive elements and rectifying diodes, a deviation in a value may be generated due to a process deviation. Particularly, in the rectifying diodes, a deviation in a turn-on voltage may be generated due to a process deviation. Therefore, a deviation in a bias current value may be generated.

A main cause of such a process deviation is that a turn-on voltage of the rectifying diode is changed depending on a process, and a technical solution for this problem is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an envelope-tracking current bias circuit includes a first rectifying circuit, a second rectifying circuit, and a first arithmetic circuit. The first rectifying circuit is configured to detect an envelope of an input signal, and provide an envelope detection signal comprising a first direct current (DC) offset voltage. The second rectifying circuit is configured to provide a second DC offset voltage corresponding to the first DC offset voltage. The first arithmetic circuit is configured to provide an envelope signal in which the first DC offset voltage is reduced through subtraction between the envelope detection signal and the second DC offset voltage.

The first rectifying circuit and the second rectifying circuit may have substantially the same circuit structure.

The first rectifying circuit may include a first rectifying unit configured to provide the envelope detection signal; and a first buffer unit connected between the first rectifying unit and the first arithmetic circuit.

The first rectifying unit may include a first capacitor having one end connected to an input terminal, and configured to block a DC component in the input signal; a first resistor connected between a power supply voltage terminal and the other end of the first capacitor; a first rectifying diode having an anode connected to the other end of the first capacitor, and configured to rectify the input signal; a second resistor connected between the cathode of the first rectifying diode and a ground; and a second capacitor connected to the second resistor in parallel, configured to smoothen the rectified signal and provide the envelope signal.

The second rectifying circuit may include a second rectifying unit configured to provide the second DC offset voltage; and a second buffer unit connected between the second rectifying unit and the first arithmetic circuit.

The second rectifying circuit may include a third capacitor having one end connected to a ground, and configured to block a DC component; a third resistor connected between a power supply voltage terminal and the other end of the third capacitor; a second rectifying diode having an anode connected to the other end of the third capacitor; a fourth resistor connected between the cathode of the second rectifying diode and the ground; and a fourth capacitor connected to the fourth resistor in parallel.

The second rectifying circuit may include a fifth resistor having one end connected to a power supply voltage terminal; a second rectifying diode having an anode connected to the other end of the fifth capacitor; a sixth resistor connected between the cathode of the second rectifying diode and the ground; and a fifth capacitor connected to the sixth resistor in parallel.

The first arithmetic circuit may include a first input resistor connected to an output terminal of the first rectifying circuit; a second input resistor connected to an output terminal of the second rectifying circuit; a first operational amplifier having a first input terminal, a second input terminal and an output terminal, the first input terminal configured to receive the envelope detection signal from the first rectifying circuit through the first input resistor, the second input terminal configured to receive the second DC offset voltage from the second rectifying circuit through the second input resistor, and the output terminal configured to output the envelope signal; a ground resistor connected between the first input terminal of the first operational amplifier and a ground; and a feedback resistor connected between the second input terminal and the output terminal of the first operational amplifier. The first and second input resistors, the ground resistor, and the feedback resistor may all have similar resistance values.

In another general aspect, an envelope-tracking current bias circuit includes a first rectifying circuit, a second rectifying circuit, a first arithmetic circuit, a first current source circuit, a second current source circuit, and a bias current generating unit. The first rectifying circuit is configured to detect an envelope of an input signal, and provide an envelope detection signal comprising a first DC offset voltage. The second rectifying circuit is configured to provide a second DC offset voltage corresponding to the first DC offset voltage. The first arithmetic circuit is configured to provide an envelope signal in which the first DC offset voltage is reduced through subtraction of the envelope detection signal from the second DC offset voltage. The first current source circuit is configured to generate a DC current based on a reference voltage, and control the DC current based on a first control signal. The second current source circuit is configured to generate an envelope-tracking (ET) current based on the envelope signal, and control the ET current based on a second control signal. The bias current generating unit is configured to generate an ET bias current based on the DC current and the ET current.

Structures of the first rectifying circuit and the second rectifying circuit may be substantially the same.

The first rectifying circuit may include a first rectifying unit configured to provide the envelope detection signal; and a first buffer unit connected between the first rectifying unit and the first arithmetic circuit.

The first rectifying unit may include a first capacitor having one end connected to an input terminal, and configured to block a DC component in the input signal; a first resistor connected between a power supply voltage terminal and the other end of the first capacitor; a first rectifying diode having an anode connected to the other end of the first capacitor, and configured to rectify the input signal; a second resistor connected between the cathode of the first rectifying diode and a ground; and a second capacitor connected to the second resistor in parallel, configured to smoothen the rectified signal, and provide the envelope signal.

The second rectifying circuit may include a second rectifying unit configured to provide the second DC offset voltage; and a second buffer unit connected between the second rectifying unit and the first arithmetic circuit.

The second rectifying circuit may include a third capacitor having one end connected to a ground, and configured to block a DC component; a third resistor connected between a power supply voltage terminal and the other end of the third capacitor; a second rectifying diode having an anode connected to the other end of the third capacitor; a fourth resistor connected between the cathode of the second rectifying diode and the ground; and a fourth capacitor connected to the fourth resistor in parallel.

The second rectifying circuit may include a fifth resistor having one end connected to a power supply voltage terminal; a second rectifying diode having an anode connected to the other end of the fifth capacitor; a sixth resistor connected between the cathode of the second rectifying diode and the ground; and a fifth capacitor connected to the sixth resistor in parallel.

The first arithmetic circuit may include a first input resistor connected to an output terminal of the first rectifying circuit; a second input resistor connected to an output terminal of the second rectifying circuit; a first operational amplifier having a first input terminal, a second input terminal, and an output terminal, the first operational amplifier configured to receive the envelope detection signal from the first rectifying circuit through the first input resistor, the second input terminal configured to receive the second DC offset voltage from the second rectifying circuit through the second input resistor, and the output terminal configured to output the envelope signal; a ground resistor connected between the first input terminal of the first operational amplifier and a ground; and a feedback resistor connected between the second input terminal and the output terminal of the first operational amplifier. The first and second input resistors, the ground resistor, and the feedback resistor may all have similar resistance values.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
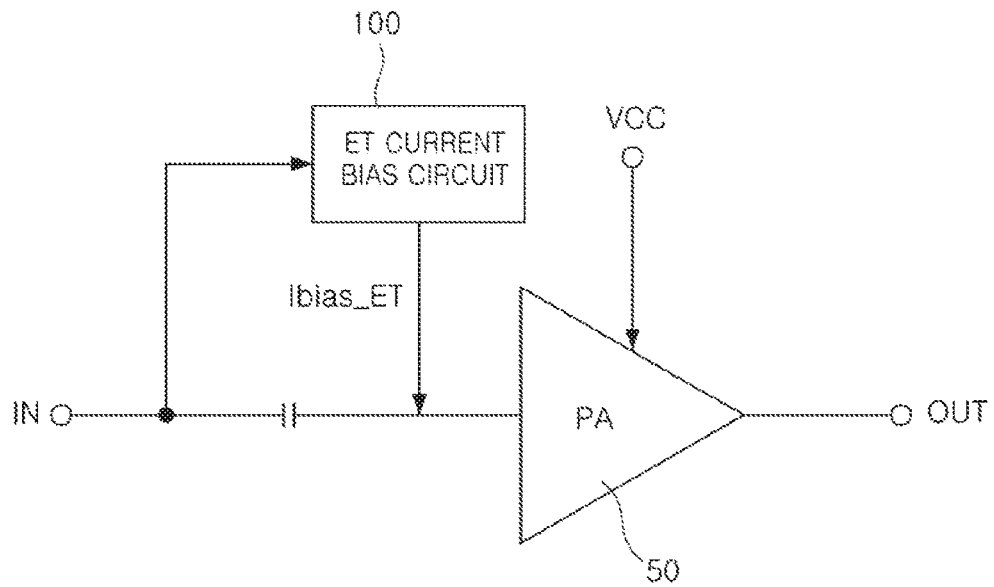
FIG. 1 is a block diagram illustrating an example of a power amplifying apparatus in the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The following description relates to an envelope-tracking current bias circuit capable of being used in a power amplifying system and reducing a direct current (DC) offset in a circuit for detecting an envelope of an input signal.

Referring to FIG. 1, a power amplifying apparatus according to an example includes a power amplifying circuit 50 and an envelope-tracking (ET) current bias circuit 100.

The ET current bias circuit 100 generates an ET bias current Ibias_ET on the bias of an envelope of an input signal, and supply the ET bias current Ibias_ET to the power amplifying circuit 50.

The power amplifying circuit 50 is operated by receiving a power supply voltage VCC and the ET bias current Ibias_ET, amplifying a signal through an input terminal IN, and providing the amplified signal through an output terminal OUT.

The power supply voltage VCC is a voltage that may be based on the envelope of the input signal.

In FIG. 1, a capacitor disposed between the input terminal IN and the power amplifying circuit 50 is a capacitor for blocking direct current (DC).

In the respective drawings in the present disclosure, an unnecessary overlapping description for components denoted by the same reference numerals and having the same functions will be omitted, and contents different from each other will be described in the respective drawings.

Figure 2:
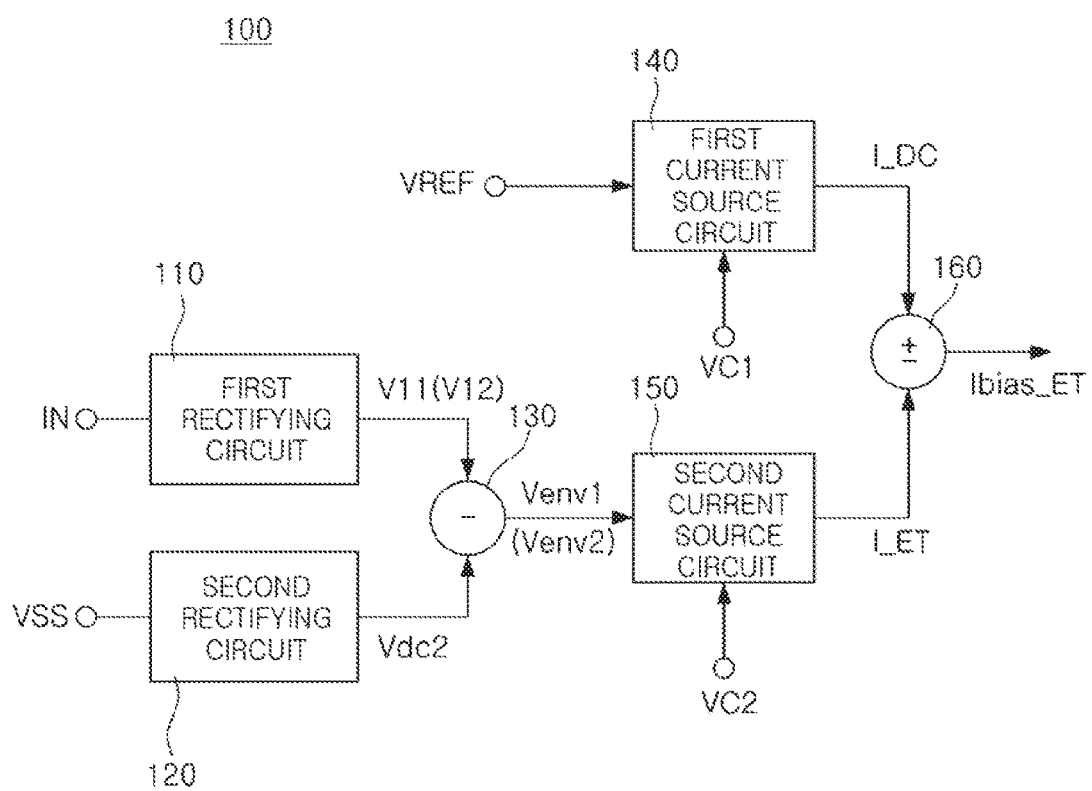
FIG. 2 is a block diagram illustrating an example of an envelope-tracking current bias circuit.

FIG. 2 is a block diagram illustrating an example of an envelope-tracking current bias circuit in the present disclosure.

Referring to FIG. 2, the envelope-tracking current bias circuit 100 includes a first rectifying circuit 110, a second rectifying circuit 120, and a first arithmetic circuit 130.

The first rectifying circuit 110 detects an envelope of an input signal, and provides an envelope detection signal V11 including a first DC offset voltage Vdc1.

The second rectifying circuit 120 provides a second DC offset voltage Vdc2 corresponding to the first DC offset voltage Vdc1.

The first arithmetic circuit 130 provides an envelope signal Venv1 in which the first DC offset voltage is reduced through subtraction between the envelope detection signal V11 and the second DC offset voltage Vdc2.

Therefore, the first DC offset voltage Vdc1 in the envelope detection signal V11 is canceled by the second DC offset voltage Vdc2.

In order to efficiently reduce the first DC offset voltage Vdc1 of the first rectifying circuit 110, the first rectifying circuit 110 has a circuit structure that's substantially the same as that of the second rectifying circuit 120.

Here, the phrase "structure that's substantially the same as" includes a structure in which elements or circuits generating DC offset voltages are the same as each other, and a structure in which elements or circuits generate substantially corresponding DC offset voltages even though they are not the same as each other.

As described above, the first DC offset voltage Vdc1 and the second DC offset voltage Vdc2 are the same as each other.

In addition, the envelope-tracking current bias circuit 100 further includes a first current source circuit 140, a second current source circuit 150, and a bias current generating unit 160.

The first current source circuit 140 generates a DC current I_DC based on a reference voltage VREF, and control the DC current I_DC depending on a first control signal VC1.

The second current source circuit 150 generates an ET current I_ET based on the envelope signal Venv1, and controls the ET current I_ET depending on a second control signal VC2. Here, the first control signal VC1 and the second control signal VC2 are determined based on operation characteristics of the corresponding power amplifying circuit.

In addition, the bias current generating unit 160 performs operation on the DC current I_DC and the ET current I_ET to generate an ET bias current Ibias_ET.

As an example, the bias current generating unit 160 performs addition or subtraction on the DC current I_DC and the ET current I_ET to generate the ET bias current Ibias_ET. The addition or the subtraction may be selected by operation characteristics of the corresponding power amplifying circuit. The operation characteristics of the corresponding power amplifying circuit may be determined by at least one of a frequency band, a bandwidth, a power mode, and a magnitude of output power.

The ET bias current Ibias_ET is instantaneously changed due to an instantaneous change in the ET current I_ET, but the average current of the ET bias current Ibias_ET is controlled to be constant in order to improve efficiency of the corresponding power amplifying circuit. When the average current of the ET bias current Ibias_ET is constant, output power and efficiency of the power amplifying circuit, which are performance indices of the power amplifying circuit, are maintained to be constant.

Here, the phrase "the average current of the ET bias current Ibias_ET is constant" means that the average current is within an allowable range in which the output power and the efficiency of the corresponding power amplifying circuit are not out of required ranges in specifications. As an example, an allowable range of the average current of the ET bias current Ibias_ET is 400 µA±a, where 400 µA is the average current of the ET bias current Ibias_ET, and "a" is an allowable error. The allowable error "a" may be 10% of the average current of the ET bias current Ibias_ET. As an example, when the average current of the ET bias current Ibias_ET is 400 µA, the allowable error "a" is 25 µA. Therefore, the average current of the ET bias current Ibias_ET may change by the allowable range.

Therefore, the average current of the ET bias current Ibias_ET generated by performing the operation (for example, the addition or the subtraction) on the DC current I_DC and the ET current I_ET is controlled to be constant, and the DC current I_DC and the ET current I_ET are controlled depending on the operation characteristics of the corresponding power amplifying circuit.

Figure 3:
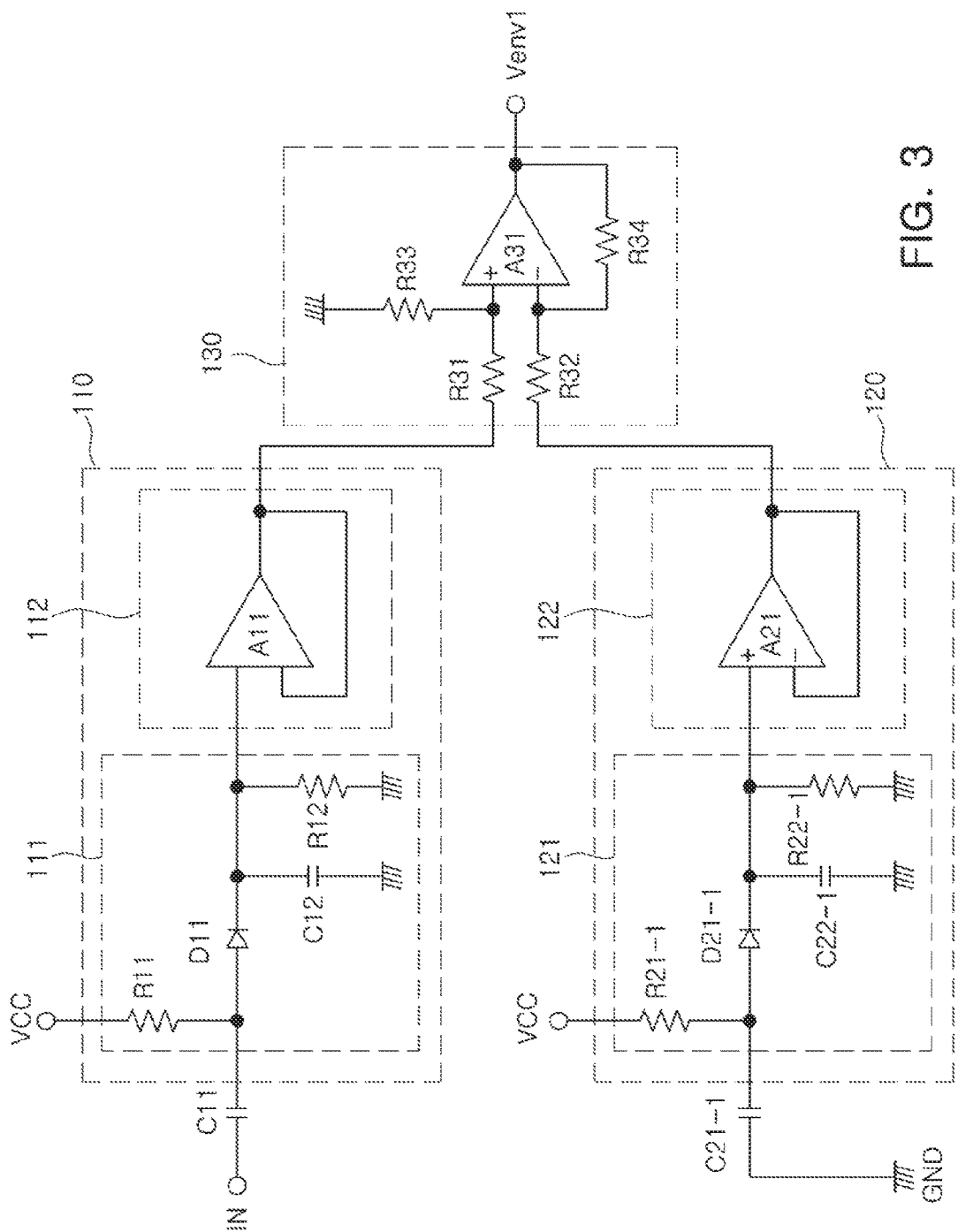
FIG. 3 is a circuit diagram illustrating an example of an envelope-tracking voltage detecting circuit.
Figure 4:
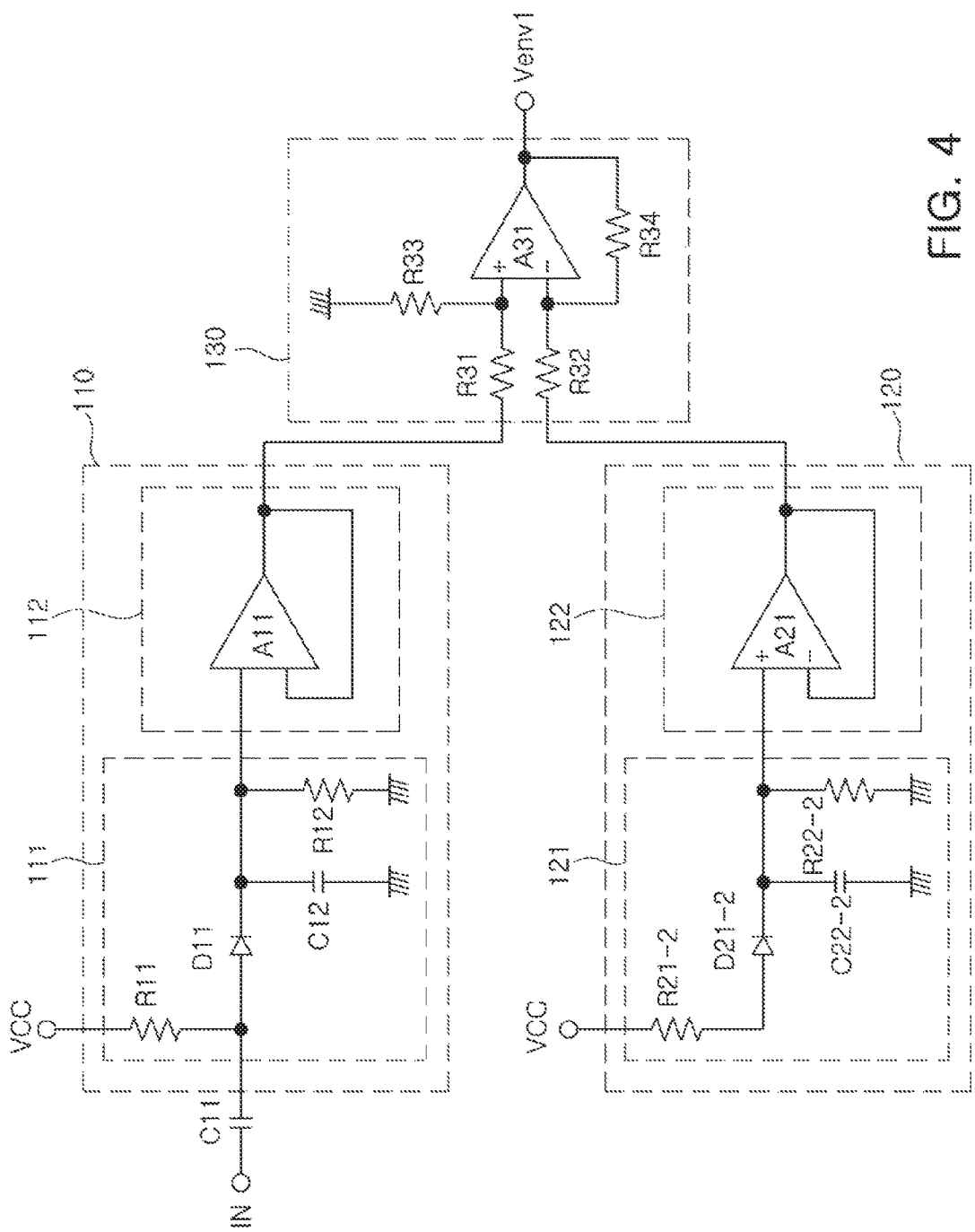
FIG. 4 is a circuit diagram illustrating another example of an envelope-tracking voltage detecting circuit.

In FIG. 2, as an example, VSS is a ground voltage (see FIG. 3) or VCC (see FIG. 4).

As an example, a V/I converting circuit (for example, an operational amplifier or a constant current circuit) changing a voltage into a current is used as each of the first current source circuit 140 and the second current source circuit 150, a manner of varying a resistance or mirroring current is used in such a V/I converting circuit, and currents output from the first current source circuit 140 and the second current source circuit 150 are varied depending on the corresponding control signals.

FIG. 3 is a circuit diagram illustrating an example of an envelope-tracking voltage detecting circuit in the present disclosure. FIG. 4 is a circuit diagram illustrating another example of an envelope-tracking voltage detecting circuit in the present disclosure.

Referring to FIGS. 3 and 4, the first rectifying circuit 110 includes a first rectifying unit 111 and a first buffer unit 112.

The first rectifying unit 111 provides the envelope detection signal V11. The first buffer unit 112 is connected between the first rectifying unit 111 and the first arithmetic circuit 130.

The first rectifying unit 111 includes a first capacitor C11, a first resistor R11, a first rectifying diode D11, a second resistor R12, and a second capacitor C12.

The first capacitor C11 has one end connected to the input terminal IN and the other end connected to an anode of the first rectifying diode D11. The first capacitor C11 blocks a DC component in the input signal. The first resistor R11 is connected between a power supply voltage VCC terminal and the other end of the first capacitor C11. The first rectifying diode D11 has the anode connected to the other end of the first capacitor C11 to rectify the input signal. The second resistor R12 is connected between the cathode of the first rectifying diode D11 and a ground. In addition, the second capacitor C12 is connected to the second resistor R12 in parallel to smoothen the rectified signal, and provide the envelope signal Venv1.

The power supply voltage VCC is divided by the first resistor R11, the first rectifying diode D11, and the second resistor R12. The voltage input to the first rectifying diode D11 is the sum of a voltage across the second resistor R12 and a turn-on voltage of the first rectifying diode D11.

An alternating current (AC) input signal is carried on a DC input voltage (DC voltage) of the first rectifying diode D11 and then input to the first rectifying diode D11.

The second rectifying circuit 120 includes a second rectifying unit 121 and a second buffer unit 122.

The second rectifying unit 121 provides the second DC offset voltage Vdc2. The second buffer unit 122 is connected between the second rectifying unit 121 and the first arithmetic circuit 130.

Referring to FIG. 3, the second rectifying circuit 120 includes a third capacitor C21-1, a third resistor R21-1, a second rectifying diode D21-1, a fourth resistor R22-1, and a fourth capacitor C22-1.

The third capacitor C21-1 has one end connected to a ground, and blocks a DC component from the ground terminal.

The third resistor R21-1 is connected between the power supply voltage VCC terminal and the other end of the third capacitor C21-1. The second rectifying diode D21-1 has an anode connected to the other end of the third capacitor C21-1. The fourth resistor R22-1 is connected between the cathode of the second rectifying diode D21-1 and a ground. In addition, the fourth capacitor C22-1 is connected to the fourth resistor R22-1 in parallel.

As described above, the first rectifying circuit 110 and the second rectifying circuit 120 have the same circuit structure, and the respective DC offset voltages of the first rectifying circuit 110 and the second rectifying circuit 120 are the same as each other. Therefore, when the voltage output from the second rectifying circuit 120 is subtracted from the voltage output from the first rectifying circuit 110, the envelope voltage from which the DC offset voltage is cancelled is output.

Referring to FIG. 4, the second rectifying circuit 120 includes a fifth resistor R21-2, a second rectifying diode D21-2, a sixth resistor R22-2, and a fifth capacitor 22-2.

The fifth resistor R21-2 has one end connected to the power supply voltage VCC terminal. The second rectifying diode D21-2 has an anode connected to the other end of the fifth capacitor R21-2. The sixth resistor R22-2 is connected between the cathode of the second rectifying diode D21-2 and a ground. In addition, the fifth capacitor C22-2 is connected to the sixth resistor R22-2 in parallel.

As described above, the first rectifying circuit 110 and the second rectifying circuit 120 have substantially the same circuit structure, and the respective DC offset voltages of the first rectifying circuit 110 and the second rectifying circuit 120 are substantially the same as each other. Therefore, when the voltage output from the second rectifying circuit 120 is subtracted from the voltage output from the first rectifying circuit 110, the envelope voltage from which the DC offset voltage is cancelled is output.

Referring to FIGS. 3 and 4, the first arithmetic circuit 130 includes a first input resistor R31, a second input resistor R32, a first operational amplifier A31, a ground resistor R33, and a feedback resistor R34.

The first input resistor R31 is connected to an output terminal of the first rectifying circuit 110. The second input resistor R32 is connected to an output terminal of the second rectifying circuit 120. The first operational amplifier A31 has a first input terminal receiving the envelope detection signal V11 from the first rectifying circuit 110 through the first input resistor 31, a second input terminal receiving the second DC offset voltage Vdc2 from the second rectifying circuit 120 through the second input resistor R32, and an output terminal outputting the envelope signal Venv1.

The ground resistor R33 is connected between the first input terminal of the first operational amplifier A31 and a ground. In addition, the feedback resistor R34 is connected between the second input terminal and the output terminal of the first operational amplifier A31.

All of the first and second input resistors R31 and R32, the ground resistor R33, and the feedback resistor R34 may have the same resistance value.

In this case, the envelope signal Venv1, which is an output voltage of the first operational amplifier A31, is determined by subtracting the second DC offset voltage Vdc2 from the envelope detection signal V11.

The first rectifying circuit and the second rectifying circuit illustrated in FIGS. 3 and 4 are only examples, and are thus not limited to those illustrated in FIGS. 3 and 4. As an example, different rectifying circuits may be used regardless of structures thereof as long as they have substantially equivalent structures.

Figure 5:
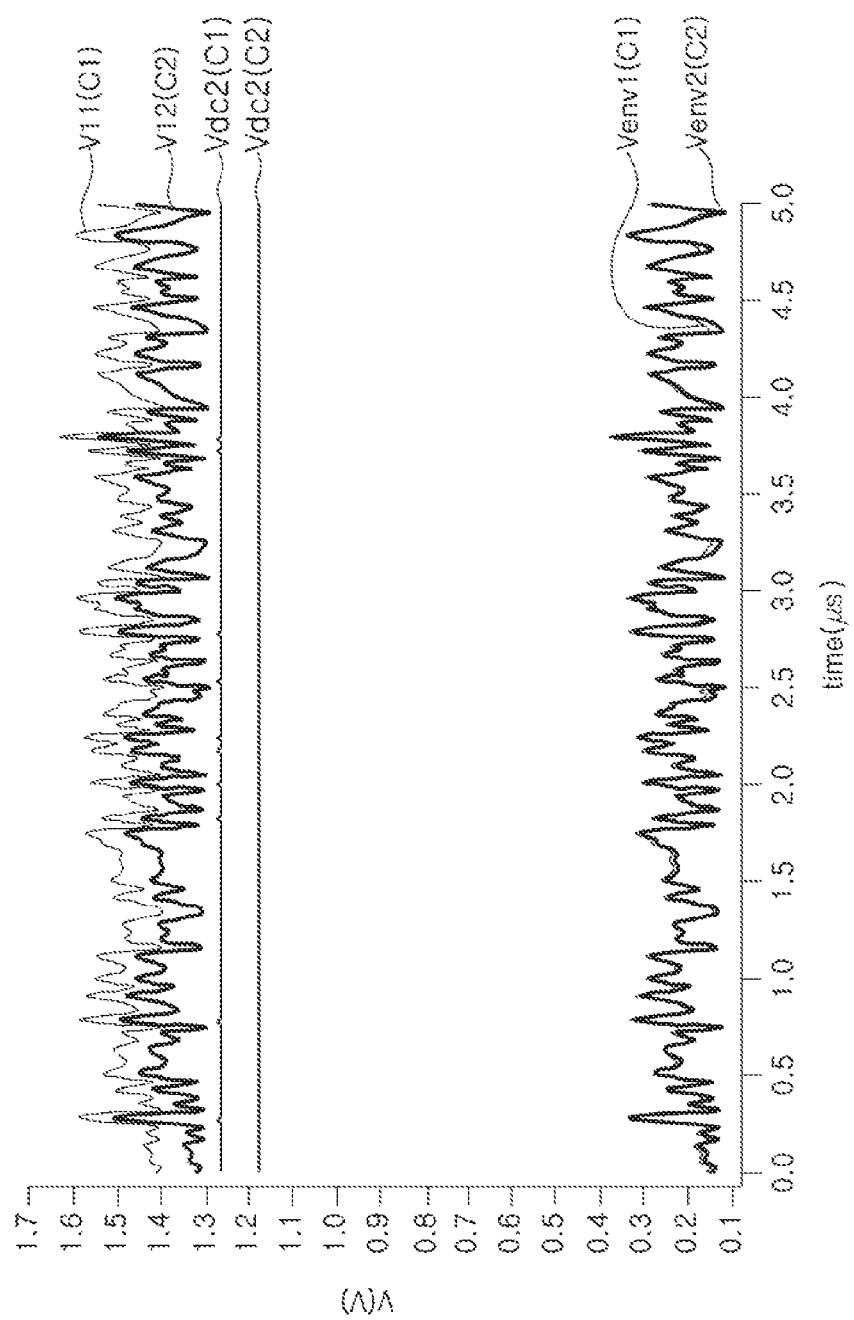
FIG. 5 illustrates waveforms of main signals according to an example in the present disclosure.

FIG. 5 illustrates waveforms of main signals according to an example in the present disclosure.

In FIG. 5, V11(C1) and V12(C2) are the envelope detection signals output from the first rectifying circuit 110, and Vdc21(C1) and Vdc22(C2) are the second DC offset voltages output from the second rectifying circuit 120. Venv1(C1) and Venv2(C2) are the envelope signals.

Here, C1 and C2 mean different cases in which any one or any two or more process (P) deviations, voltage (V) deviations, and temperature (T) deviations are different from each other. C1 may be a first case in which a turn-on voltage of a rectifying diode of a rectifying circuit due to a process deviation is low, a power supply voltage is high, and an operating temperature is 100° C. C2 may be a second case in which a turn-on voltage of a rectifying diode of a rectifying circuit due to a process deviation is high, a power supply voltage is low, and an operating temperature is −45° C.

It is appreciated from FIG. 5 that even in the cases in which the process (P) deviations, the voltage (V) deviations, and the temperature (T) deviations are different from each other as in C1 and C2, when the second DC offset voltage Vdc21 or Vdc22 output from the second rectifying circuit 120 is subtracted from the envelope detection signal V11 or V12 output from the first rectifying circuit 110, a substantially similar envelope signal Venv1 or Venv2 is generated.

Figure 6:
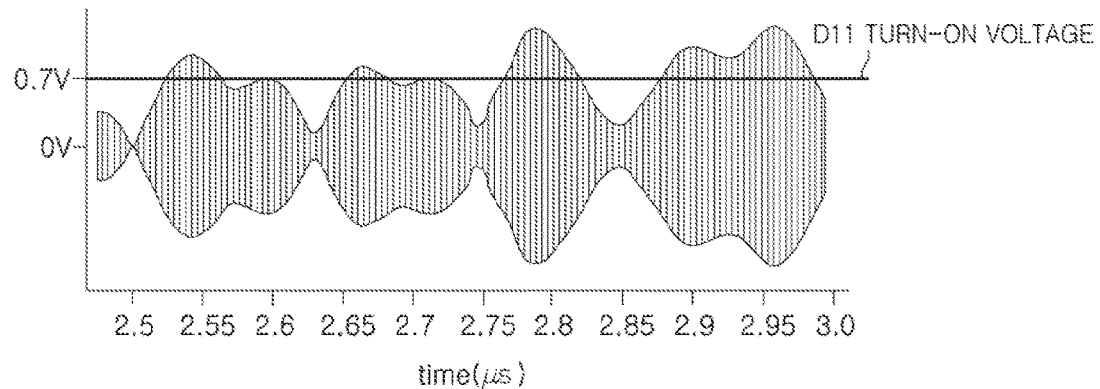
FIG. 6 illustrates waveforms of an input signal and a turn-on voltage of a rectifying diode in related art.
Figure 7:
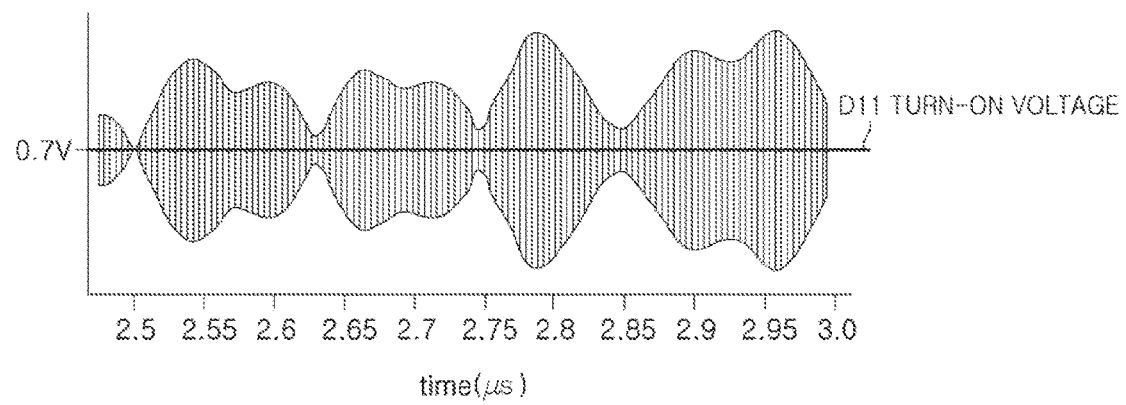
FIG. 7 illustrates waveforms of an input signal and a turn-on voltage of a rectifying diode according to an example in the present disclosure.

FIG. 6 illustrates waveforms of an input signal and a turn-on voltage of a rectifying diode in related art, and FIG. 7 illustrates waveforms of an input signal and a turn-on voltage of a rectifying diode according to an example in the present disclosure.

In FIG. 6, an example in which a center level of an input signal input to a first rectifying circuit is a zero voltage and a turn-on voltage of a rectifying diode is 0.7V in the related art is illustrated. In this case, the envelope of the input signal is not detected by the rectifying diode.

In FIG. 7, an example in which a center level of an input signal input to a first rectifying circuit is 0.7V and a turn-on voltage of a rectifying diode is 0.7V according to an example in the present disclosure is illustrated. In this case, the envelope of the input signal is more accurately detected by the rectifying diode in the present disclosure.

Figure 8:
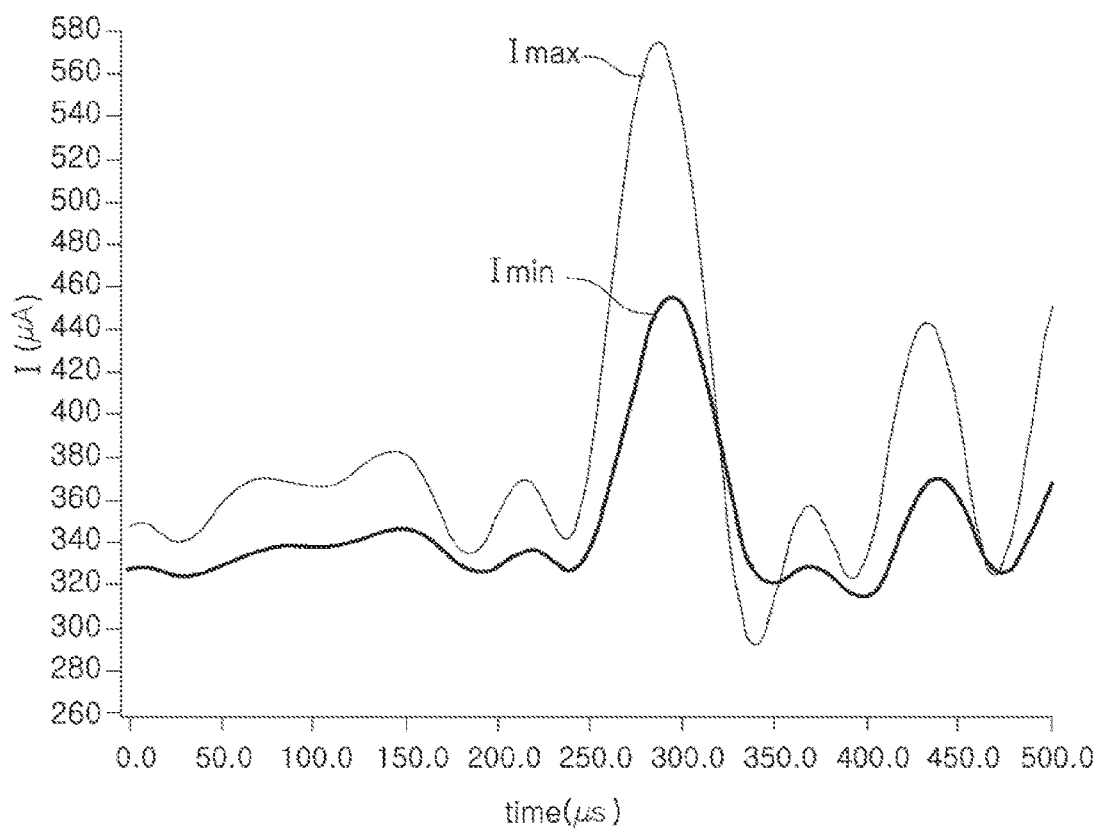
FIG. 8 illustrates a deviation in an envelope detecting signal in related art.
Figure 9:
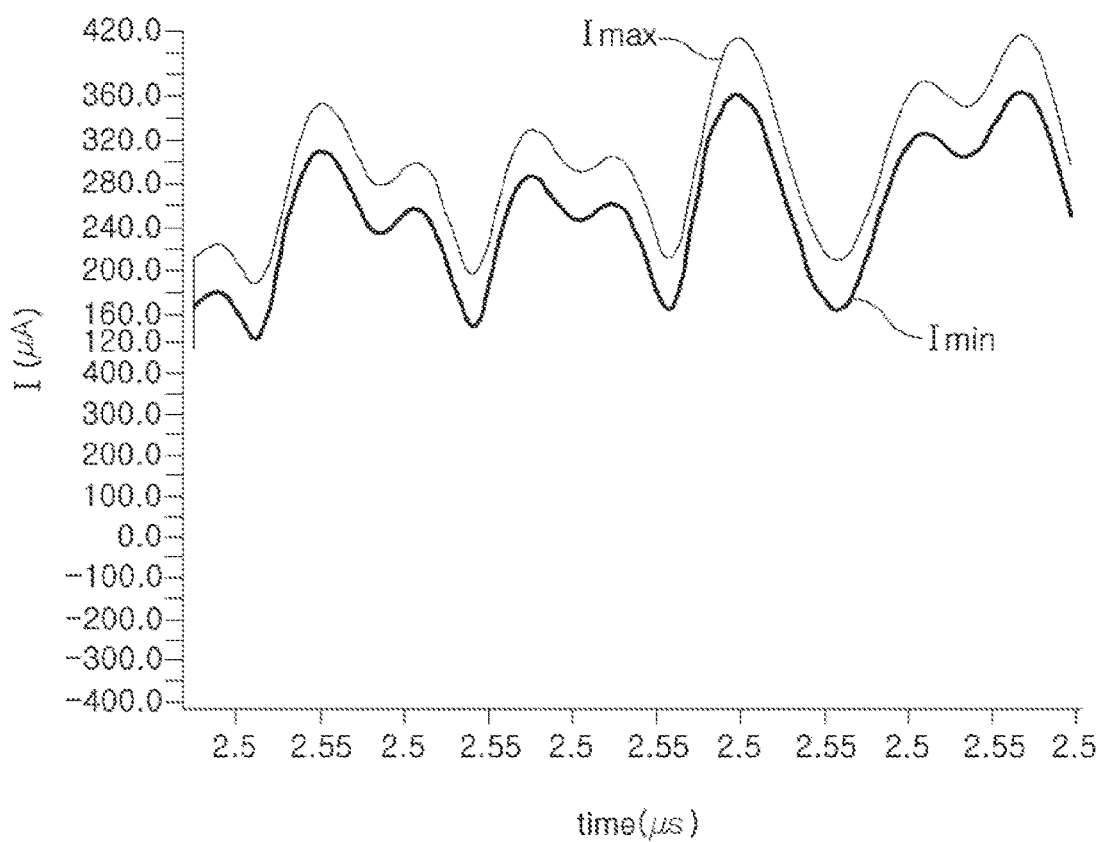
FIG. 9 illustrates a deviation in an envelope detecting signal according to an example in the present disclosure.

FIG. 8 illustrates a deviation in an envelope detecting signal based on the related art, and FIG. 9 illustrates a deviation in an envelope detecting signal based on an example in the present disclosure.

In FIGS. 8 and 9, the vertical axis indicates a current in microamperes (μA) and the horizontal axis indicates a time in nanoseconds (ns).

At the highest point of the graphs in FIG. 8, in one example, the maximum current is approximately 580 uA and the minimum current is approximately 440 uA. Referring to FIG. 8, the variation in the related art is approximately +60 uA (+−11.5%) based on the normal current of 520 uA. In contrast, at the highest point of the graphs in FIG. 9, in one example, the maximum current is approximately 420 uA and the minimum current is approximately 360 uA. Referring to FIG. 9, the variation according to according to an example in the present disclosure is approximately +30 uA (+−7.6%) based on the normal current of 390 uA.

It is appreciated from FIGS. 8 and 9 that a change in an ET current due to a process deviation is reduced in an envelope-tracking current bias circuit based on the examples in the present disclosure as compared to an envelope-tracking current bias circuit of the related art.

As set forth above, according to the examples in the present disclosure, a DC offset of a circuit for detecting an envelope of an input signal is reduced, and a variation in a detection signal due to a process deviation is also reduced, such that the envelope in the input signal is more accurately detected.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An envelope-tracking current bias circuit comprising:
a first rectifying circuit configured to detect an envelope of an input signal, and provide an envelope detection signal comprising a first direct current (DC) offset voltage;
a second rectifying circuit configured to provide a second DC offset voltage corresponding to the first DC offset voltage; and
a first arithmetic circuit configured to provide an envelope signal in which the first DC offset voltage is reduced through subtraction between the envelope detection signal and the second DC offset voltage.

2. The envelope-tracking current bias circuit of claim 1, wherein the first rectifying circuit and the second rectifying circuit have substantially the same circuit structure.

3. The envelope-tracking current bias circuit of claim 1, wherein the first rectifying circuit comprises:

a first rectifying unit configured to provide the envelope detection signal; and a first buffer unit connected between the first rectifying unit and the first arithmetic circuit.

4. The envelope-tracking current bias circuit of claim 3, wherein the first rectifying unit comprises:

a first capacitor having one end connected to an input terminal, and configured to block a DC component in the input signal;

a first resistor connected between a power supply voltage terminal and the other end of the first capacitor;

a first rectifying diode having an anode connected to the other end of the first capacitor, and configured to rectify the input signal;

a second resistor connected between a cathode of the first rectifying diode and a ground; and a second capacitor connected to the second resistor in parallel, configured to smoothen the rectified signal and provide the envelope signal.

5. The envelope-tracking current bias circuit of claim 1, wherein the second rectifying circuit comprises:

a second rectifying unit configured to provide the second DC offset voltage; and a second buffer unit connected between the second rectifying unit and the first arithmetic circuit.

6. The envelope-tracking current bias circuit of claim 5, wherein the second rectifying circuit comprises:

a third capacitor having one end connected to a ground, and configured to block a DC component;

a third resistor connected between a power supply voltage terminal and the other end of the third capacitor;

a second rectifying diode having an anode connected to the other end of the third capacitor;

a fourth resistor connected between a cathode of the second rectifying diode and the ground; and a fourth capacitor connected to the fourth resistor in parallel.

7. The envelope-tracking current bias circuit of claim 5, wherein the second rectifying circuit comprises:

a fifth resistor having one end connected to a power supply voltage terminal;

a second rectifying diode having an anode connected to the other end of the fifth capacitor;

a sixth resistor connected between a cathode of the second rectifying diode and the ground; and a fifth capacitor connected to the sixth resistor in parallel.

8. The envelope-tracking current bias circuit of claim 1, wherein the first arithmetic circuit comprises:

a first input resistor connected to an output terminal of the first rectifying circuit;

a second input resistor connected to an output terminal of the second rectifying circuit;

a first operational amplifier having a first input terminal, a second input terminal and an output terminal, the first input terminal configured to receive the envelope detection signal from the first rectifying circuit through the first input resistor, the second input terminal configured to receive the second DC offset voltage from the second rectifying circuit through the second input resistor, and the output terminal configured to output the envelope signal;

a ground resistor connected between the first input terminal of the first operational amplifier and a ground; and a feedback resistor connected between the second input terminal and the output terminal of the first operational amplifier, and wherein the first and second input resistors, the ground resistor, and the feedback resistor all have similar resistance values.

9. An envelope-tracking current bias circuit, comprising:

a first rectifying circuit configured to detect an envelope of an input signal, and provide an envelope detection signal comprising a first DC offset voltage;

a second rectifying circuit configured to provide a second DC offset voltage corresponding to the first DC offset voltage;

a first arithmetic circuit configured to provide an envelope signal in which the first DC offset voltage is reduced through subtraction of the envelope detection signal from the second DC offset voltage;

a first current source circuit configured to generate a DC current based on a reference voltage, and control the DC current based on a first control signal;

a second current source circuit configured to generate an envelope-tracking (ET) current based on the envelope signal, and control the ET current based on a second control signal; and a bias current generating unit configured to generate an ET bias current based on the DC current and the ET current.

10. The envelope-tracking current bias circuit of claim 9, wherein structures of the first rectifying circuit and the second rectifying circuit are substantially the same.

11. The envelope-tracking current bias circuit of claim 9, wherein the first rectifying circuit comprises:

a first rectifying unit configured to provide the envelope detection signal; and a first buffer unit connected between the first rectifying unit and the first arithmetic circuit.

12. The envelope-tracking current bias circuit of claim 11, wherein the first rectifying unit comprises:

a first capacitor having one end connected to an input terminal, and configured to block a DC component in the input signal;

a first resistor connected between a power supply voltage terminal and the other end of the first capacitor;

a first rectifying diode having an anode connected to the other end of the first capacitor, and configured to rectify the input signal;

a second resistor connected between a cathode of the first rectifying diode and a ground; and a second capacitor connected to the second resistor in parallel, configured to smoothen the rectified signal, and provide the envelope signal.

13. The envelope-tracking current bias circuit of claim 9, wherein the second rectifying circuit comprises:

a second rectifying unit configured to provide the second DC offset voltage; and a second buffer unit connected between the second rectifying unit and the first arithmetic circuit.

14. The envelope-tracking current bias circuit of claim 13, wherein the second rectifying circuit comprises:

a third capacitor having one end connected to a ground, and configured to block a DC component;

a third resistor connected between a power supply voltage terminal and the other end of the third capacitor;

a second rectifying diode having an anode connected to the other end of the third capacitor;

a fourth resistor connected between a cathode of the second rectifying diode and the ground; and a fourth capacitor connected to the fourth resistor in parallel.

15. The envelope-tracking current bias circuit of claim 13, wherein the second rectifying circuit comprises:
- a fifth resistor having one end connected to a power supply voltage terminal;
- a second rectifying diode having an anode connected to the other end of the fifth capacitor;
- a sixth resistor connected between a cathode of the second rectifying diode and the ground; and
- a fifth capacitor connected to the sixth resistor in parallel.

16. The envelope-tracking current bias circuit of claim 9, wherein the first arithmetic circuit comprises:
- a first input resistor connected to an output terminal of the first rectifying circuit;
- a second input resistor connected to an output terminal of the second rectifying circuit;
- a first operational amplifier having a first input terminal, a second input terminal, and an output terminal, the first operational amplifier configured to receive the envelope detection signal from the first rectifying circuit through the first input resistor, the second input terminal configured to receive the second DC offset voltage from the second rectifying circuit through the second input resistor, and the output terminal configured to output the envelope signal;
- a ground resistor connected between the first input terminal of the first operational amplifier and a ground; and
- a feedback resistor connected between the second input terminal and the output terminal of the first operational amplifier, and
- wherein the first and second input resistors, the ground resistor, and the feedback resistor all have similar resistance values.

* * * * *